(12) United States Patent
Jeon et al.

(10) Patent No.: US 12,289,844 B2
(45) Date of Patent: Apr. 29, 2025

(54) DISPLAY DEVICE

(71) Applicant: LG DISPLAY CO., LTD., Seoul (KR)

(72) Inventors: Eun-Gi Jeon, Paju-si (KR); Young-Kyu Bang, Paju-si (KR); Sung-Hwan Yoon, Paju-si (KR); Seoung-Mo Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 222 days.

(21) Appl. No.: 18/083,606

(22) Filed: Dec. 19, 2022

(65) Prior Publication Data

US 2023/0209747 A1    Jun. 29, 2023

(30) Foreign Application Priority Data

Dec. 27, 2021 (KR) .......................... 10-2021-0187979

(51) Int. Cl.
| | |
|---|---|
| *H05K 5/02* | (2006.01) |
| *F16H 19/06* | (2006.01) |
| *G02F 1/1333* | (2006.01) |
| *G06F 1/16* | (2006.01) |
| *H10K 77/10* | (2023.01) |

(52) U.S. Cl.
CPC ..... *H05K 5/0217* (2013.01); *G02F 1/133308* (2013.01); *G06F 1/1601* (2013.01); *F16H 2019/0613* (2013.01); *H10K 77/111* (2023.02)

(58) Field of Classification Search
CPC .... G06F 1/1601; G06F 1/1652; G06F 1/1615; H05K 5/0217; G02F 1/133308; F16G 3/02; F16G 13/06; G09F 9/301; H04M 1/0268
See application file for complete search history.

(56) References Cited

U.S. PATENT DOCUMENTS

| | | | | |
|---|---|---|---|---|
| 5,129,611 | A * | 7/1992 | Grover | F16M 11/42 248/676 |
| 5,720,202 | A * | 2/1998 | Senjo | F16H 25/24 74/89.32 |
| 7,042,528 | B2 * | 5/2006 | Lester | B64D 11/00153 348/836 |
| 7,128,003 | B2 * | 10/2006 | Okninski | A47B 81/064 108/147 |
| 8,763,482 | B2 * | 7/2014 | Fejer | E05F 15/619 74/89.1 |
| 9,482,313 | B2 * | 11/2016 | Saji | B66F 3/06 |

(Continued)

FOREIGN PATENT DOCUMENTS

| | | |
|---|---|---|
| KR | 20140147497 A | 12/2014 |
| KR | 10-2021-0049313 A | 5/2021 |
| KR | 102252777 B1 | 5/2021 |

OTHER PUBLICATIONS

Korean Office Action dated Dec. 2, 2024 issued in Patent Application No. 10-2021-0187979 (5 pages).

*Primary Examiner* — Rockshana D Chowdhury
*Assistant Examiner* — Martin Antonio Asmat Uceda
(74) *Attorney, Agent, or Firm* — Fish & Richardson P.C.

(57) ABSTRACT

A display device includes a cover module having a storage space therein, a display panel configured to be at least partially disposed inside the storage space or withdrawn outside the storage space, and a first driving system configured to embed the display panel into the cover module or withdraw the display panel from the cover module in a first direction, wherein the first driving system includes a first rigid chain.

16 Claims, 12 Drawing Sheets

(56) References Cited

U.S. PATENT DOCUMENTS

| | | | | |
|---|---|---|---|---|
| 9,772,657 | B2* | 9/2017 | Takayanagi | H04M 1/0268 |
| 10,111,344 | B2* | 10/2018 | Han | H05K 7/1427 |
| 10,175,792 | B2* | 1/2019 | Kim | G06F 1/1652 |
| 10,492,607 | B2* | 12/2019 | Choi | H05K 5/02 |
| 10,931,166 | B1* | 2/2021 | Luo | G09F 9/301 |
| 11,194,363 | B2* | 12/2021 | Kim | H04M 1/0268 |
| 11,521,521 | B2* | 12/2022 | Chung | G09F 11/21 |
| 11,721,247 | B2* | 8/2023 | Yamamoto | G06F 1/1652 |
| | | | | 361/679.06 |
| 2006/0075550 | A1* | 4/2006 | Hanson | A47C 21/003 |
| | | | | 5/2.1 |
| 2021/0294553 | A1* | 9/2021 | Jackson | G09F 13/18 |

\* cited by examiner

DISPLAY DEVICE

CROSS-REFERENCE TO RELATED APPLICATION

The present application claims the priority of Korean Patent Application No. 10-2021-0187979 filed on Dec. 27, 2021, which is hereby incorporated by reference in its entirety.

BACKGROUND

Field of the Disclosure

The present disclosure relates to a display device, and more particularly to, for example, without limitation, a display device including a display panel capable of being raised or lowered.

Description of the Background

In recent years, with entering into a full-fledged information age, there is a growing interest in information display dealing with and displaying mass information. In response to this, various flat panel display devices have been developed and have been in the spotlight.

Specific examples of the flat panel display devices include and not limited to liquid crystal display (LCD) devices, plasma display panel (PDP) devices, field emission display (FED) devices, electroluminescence display (ELD) devices, organic light-emitting diode display (OLED) devices and the like. The flat panel display devices show excellent performance of thin thickness, light weight, and low power consumption and have rapidly replaced cathode ray tube (CRT) display devices.

In the process of developing technologies for implementing these display devices in recent years, a technology for implementing a design desired by a consumer is also required for a display device beyond a technology for displaying an image.

Recently, in the progress of further development of technologies for implementing such display devices, technologies for realizing various display devices desired by consumers are also required beyond the technology for displaying an image.

Among these, research is being actively conducted to realize various types of display devices in which a display panel is coupled to structures such as furniture, appliances, vehicle, and facilities, and to have advantages of space utilization, interior, and design.

The description provided in the description of the related art section should not be assumed to be prior art merely because it is mentioned in or associated with the description of the related art section. The description of the related art section may include information that describes one or more aspects of the subject technology.

SUMMARY

Therefore, the inventors have recognized requirements described above. Accordingly, the present disclosure is to provide a display device that substantially obviates one or more of the issues due to limitations and disadvantages described above.

More specifically, the present disclosure is to provide a display device capable of embedding or withdrawing a display panel in a structure as necessary.

The present disclosure is also to provide a display device in which a display panel is allowed to be embedded in or withdrawn from the inside of the structure with a simplified configuration and operation.

Further, the present disclosure is to provide a display device capable of raising or lowering a display panel more stably in the process of embedding or withdrawing the display panel.

Additional features and aspects will be set forth in the description that follows, and in part will be apparent from the description, or may be learned by practice of the inventive concepts provided herein. Other features and aspects of the inventive concepts may be realized and attained by the structures particularly pointed out in the present disclosure, or derivable therefrom, and the claims hereof as well as the appended drawings.

To achieve these and other aspects of the inventive concepts, as embodied and broadly described herein, a display device may include a cover module having a storage space therein, a display panel configured to be at least partially disposed inside the storage space or withdrawn outside the storage space, and a first driving system configured to embed and withdraw the display panel into and from the cover module in a first direction, wherein the first driving system may include a first rigid chain.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which may be included to provide a further understanding of the present disclosure and which may be incorporated in and constitute a part of the present disclosure, illustrate aspects of the disclosure and together with the description serve to explain various principles of the present disclosure.

In the drawings.

Figure 1A:
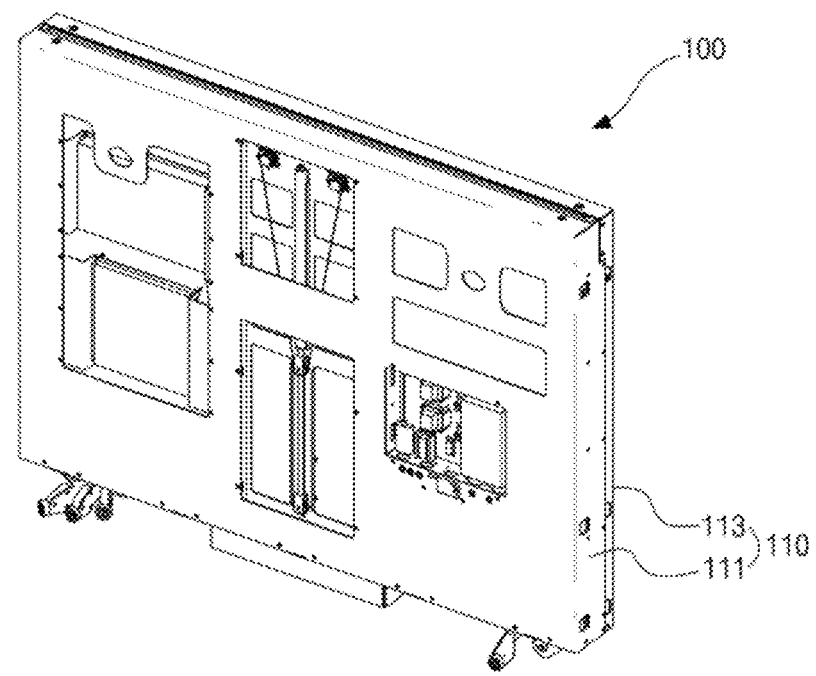
FIG. 1A is a perspective view schematically illustrating a display device with a display panel in an embedded state according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to the exemplary aspects of the present disclosure, examples of which may be illustrated in the accompanying drawings. Wherever possible, the same reference numbers will be used throughout the drawings to refer to the same or like parts.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects may be provided so that this disclosure may be sufficiently thorough and complete to assist those skilled in the art to will fully understand the scope of the present disclosure.

Shapes, sizes, areas, ratios, angles, and numbers disclosed in the drawings for describing aspects of the present disclosure may be merely example, and thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration will be omitted or may be briefly provided. When terms "comprise," "have," and "include" described in the present disclosure may be used, another part may be added unless a more limiting term, such as "only" is used. The terms of a singular form may include plural forms unless referred to the contrary.

In construing an element, the element is construed as including an error or tolerance range although there is no explicit description of such an error or tolerance range.

In the description of the various aspects of the present disclosure, where position relationships, for example, where a positional relation between two parts is described using "on," "over," "under," "above," "below," "beside" and "next" or the like, one or more other parts may be located between the two parts unless a more limiting term, such as "immediate(ly)" or "direct(ly)" is used.

In describing a temporal relationship, for example, when the temporal order is described as, for example, "after," "subsequent," "next," and "before," a case that is not continuous may be included unless a more limiting term, such as "just," "immediate(ly)," or "direct(ly)" is used.

In describing elements of the present disclosure, the terms "first," "second," "A," "B," "(a)," "(b)," etc. may be used. These terms may be merely for differentiating one element from another element, and the essence, sequence, basis, order, or number of the corresponding elements should not be limited by these terms. The expression that an element is "connected," "coupled," or "adhered" to another element or layer should be understood to mean that the element or layer can not only be directly connected or adhered to another element or layer, but also be indirectly connected or adhered to another element or layer with one or more intervening elements or layers being "disposed," or "interposed" between the elements or layers, unless otherwise specified.

The term "at least one" should be understood as including any and all combinations of one or more of the associated listed items. For example, the meaning of "at least one of a first item, a second item, and a third item" encompasses the combination of all three listed items, combinations of any two of the three items as well as each individual item, the first item, the second item, or the third item.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, aspects of the present disclosure will be described in detail with reference to the accompanying drawings. Also, for convenience of description, a scale, size and thickness in which each of elements is illustrated in the accompanying drawings may differ from a real scale, size and thickness, and thus, the illustrated elements are not limited to the specific scale, size and thickness in which they are illustrated in the drawings.

Figure 1B:
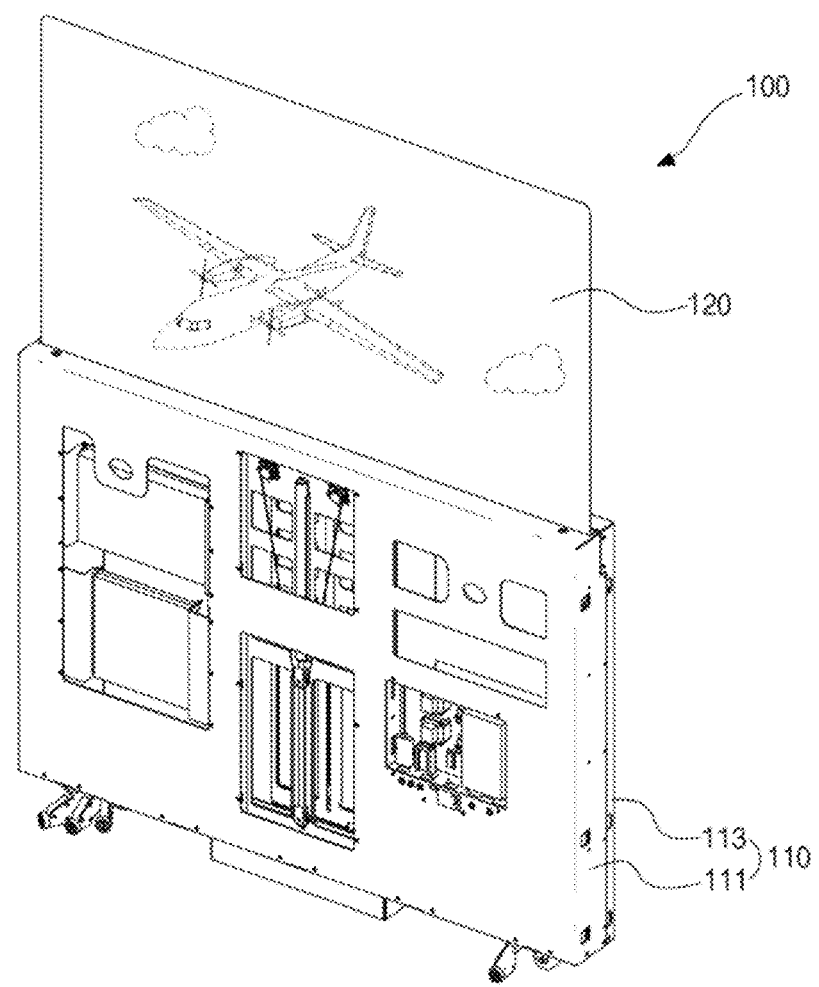
FIGS. 1B, FIG. 1C and FIG. 1D are perspective views schematically illustrating a display device with a display panel in various withdrawn states according to an aspect of the present disclosure.
Figure 1C:
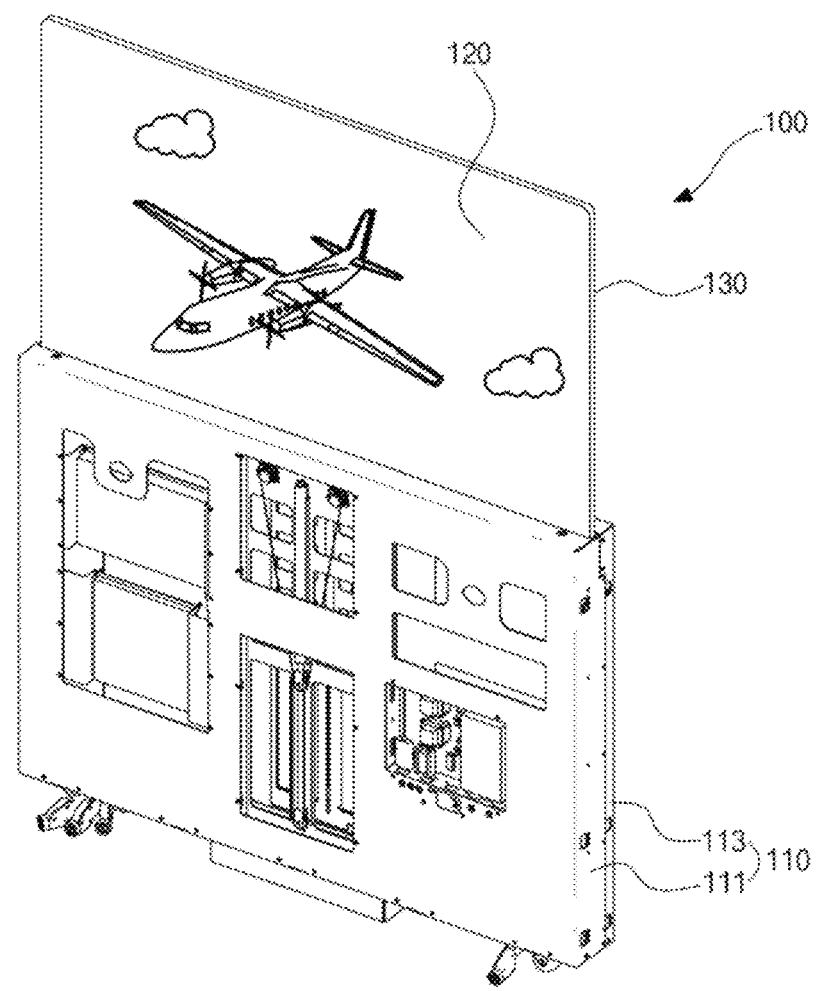
Figure 1D:
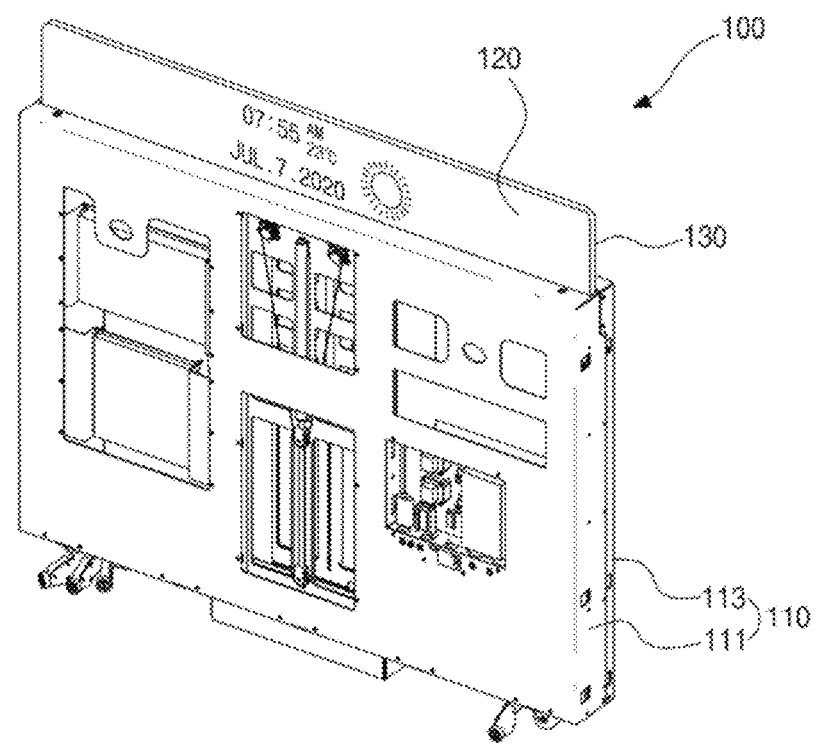

FIG. 1A is a perspective view schematically illustrating a display device with a display panel in an embedded state according to an aspect of the present disclosure, and FIGS. 1B, 1C and 1D are perspective views schematically illustrating a display device with a display panel in various withdrawn states according to an aspect of the present disclosure.

As shown in FIG. 1A, the display device 100 may include a display panel 120 (not shown in FIG. 1A) that is embedded in a cover module 110. The cover module 110 can be coupled to furniture, an appliance, a vehicle, a facility, or the like such as a bed headboard, a desk, or a partition, but aspects of the present disclosure are not limited thereto.

The display panel 120 pulled down and embedded inside the cover module 110, as shown in FIG. 1B, can be pulled up and withdrawn entirely to the outside of the cover module 110.

Here, the display panel 120 according to the aspect of the present disclosure can be formed of a transparent display panel, so that the user can see the object or image located on the opposite side through the display panel 120. In addition, the user can watch an image at both one side and the other side of the display panel 120.

When the display panel 120 is formed of a transparent display panel, as shown in FIG. 1C, a light blocking plate 130 can be further withdrawn from the cover module 110 to the rear surface of the display panel 120.

By preventing or alleviating the object or image located on the opposite side of the display panel 120 from being transmitted through the light blocking plate 130, the concentration of an image implemented through the display panel 120 can be improved. Accordingly, the user can feel the image implemented from the display panel 120 more clearly.

For example, the transparent display panel can realize the functions of information recognition, information processing, and information display as a transparent electronic device, thereby solving the spatial and visual constraints of existing electronic devices.

For example, the transparent display panel can be implemented as a smart window that is applied to a window of a building or a car to show a background or display an image. As recognized by the inventors of present disclosure, the transparent display panel does not have a limitation in contrast ratio in a dark environment, but has a disadvantage in that the contrast ratio is lowered in a general environment with light.

Therefore, the light blocking plate 130 can be further withdrawn from the cover module 110 to the rear surface of the display panel 120 so that a light blocking mode for blocking light and a transmission mode for transmitting light can be implemented in order to prevent or reduce a decrease in the contrast ratio of the transparent display panel.

In addition, as shown in FIG. 1D, in the display device 100 according to the aspect of the present disclosure, only a part of the display panel 120 can be withdrawn from the cover module 110, and most of the display panel 120 can be embedded inside the cover module 110, so that an Always On Display (AOD) device can also be implemented.

The AOD device can display AOD data that the user can check at any time even in a state where no image is displayed on the display panel 120. The AOD data can include, for example, but not limited to, information on date, time, weather, event alarming, temperature, and the like, and the AOD data can be variously changed according to the user's setting.

Figure 2A:
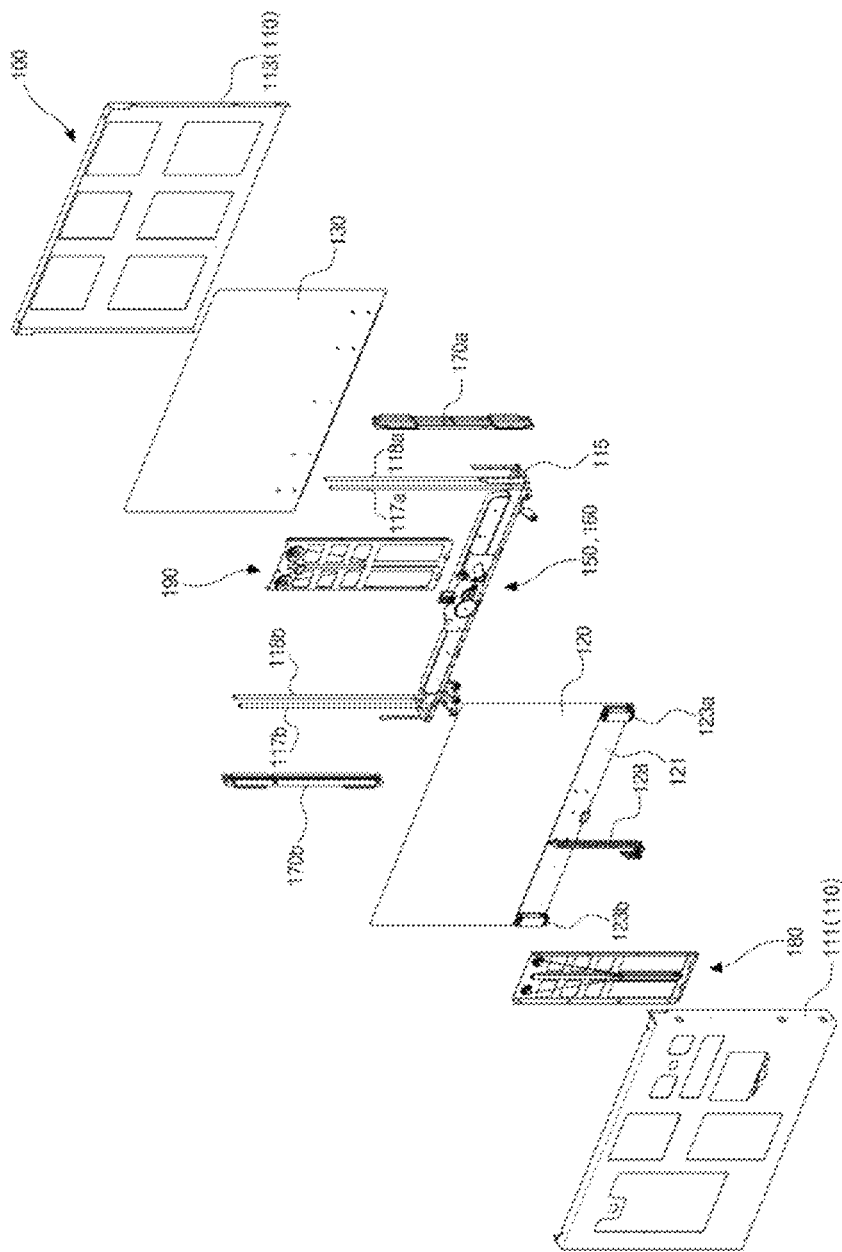
FIG. 2A is an exploded perspective view illustrating a display device according to an aspect of the present disclosure.
Figure 2B:
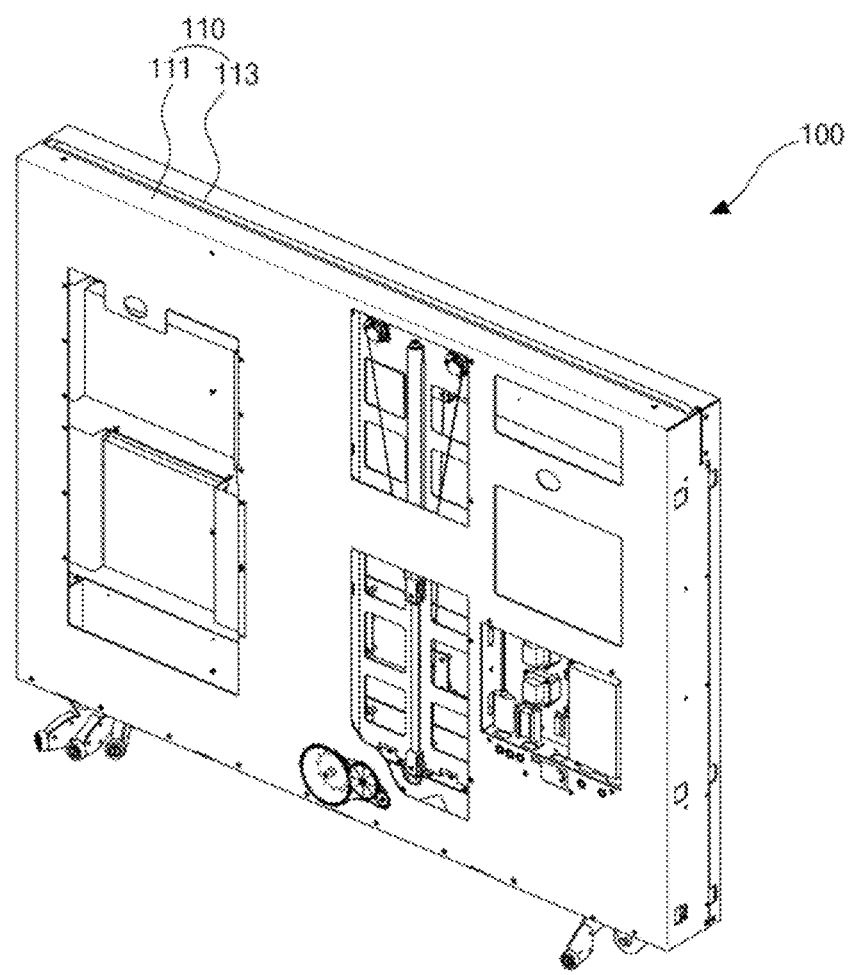
FIG. 2B is a perspective view illustrating a modularized display device according to an aspect of the present disclosure.
Figure 2C:
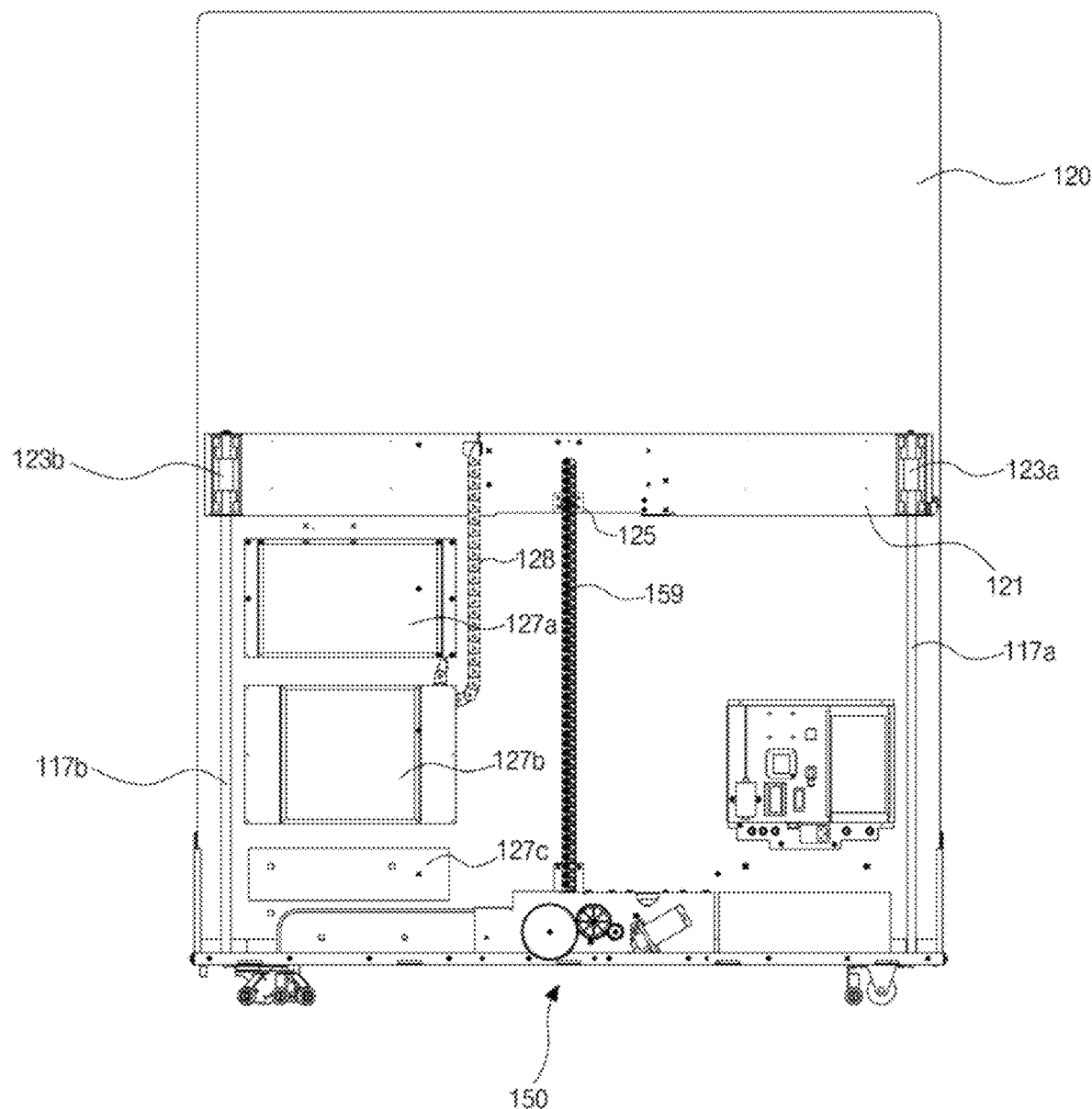
FIG. 2C is a perspective view illustrating a display device with a display panel pulled up from a cover module according to an aspect of the present disclosure.

FIG. 2A is an exploded perspective view illustrating a display device according to an aspect of the present disclosure, FIG. 2B is a perspective view illustrating a modularized display device according to an aspect of the present disclosure, and FIG. 2C is a perspective view illustrating a display device with a display panel pulled up from a cover module according to an aspect of the present disclosure.

Figure 3A:
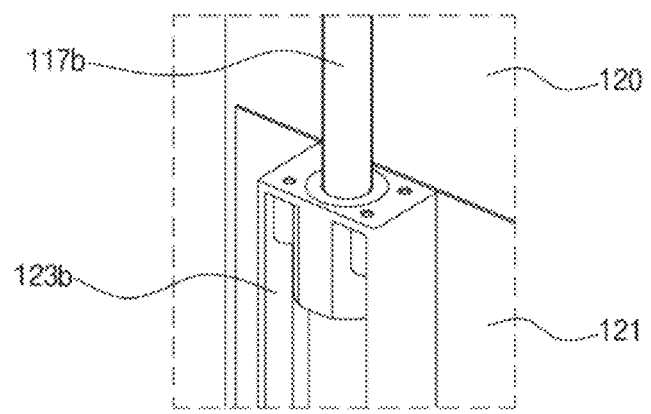
FIG. 3A is a perspective view illustrating a configuration of a bushing and a guide bar according to an aspect of the present disclosure.
Figure 3B:
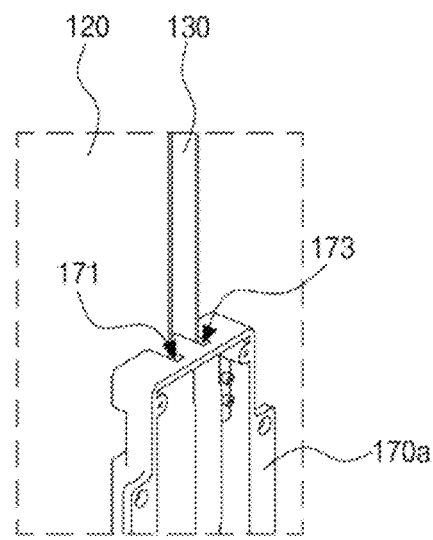
FIG. 3B is a perspective view illustrating a configuration of a guide rail according to an aspect of the present disclosure.

FIG. 3A is a perspective view illustrating a configuration of a bushing and a guide bar according to an aspect of the present disclosure, and FIG. 3B is a perspective view illustrating a configuration of a guide rail according to an aspect of the present disclosure.

Figure 4A:
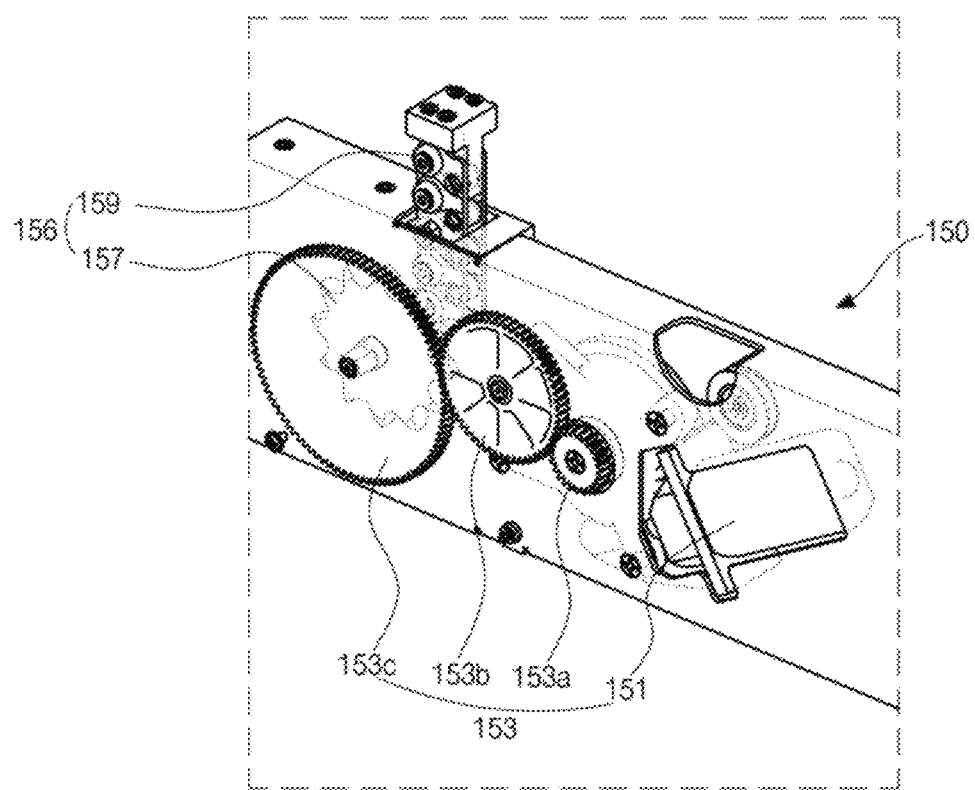
FIG. 4A is a perspective view illustrating a first driving system according to an aspect of the present disclosure.
Figure 4B:
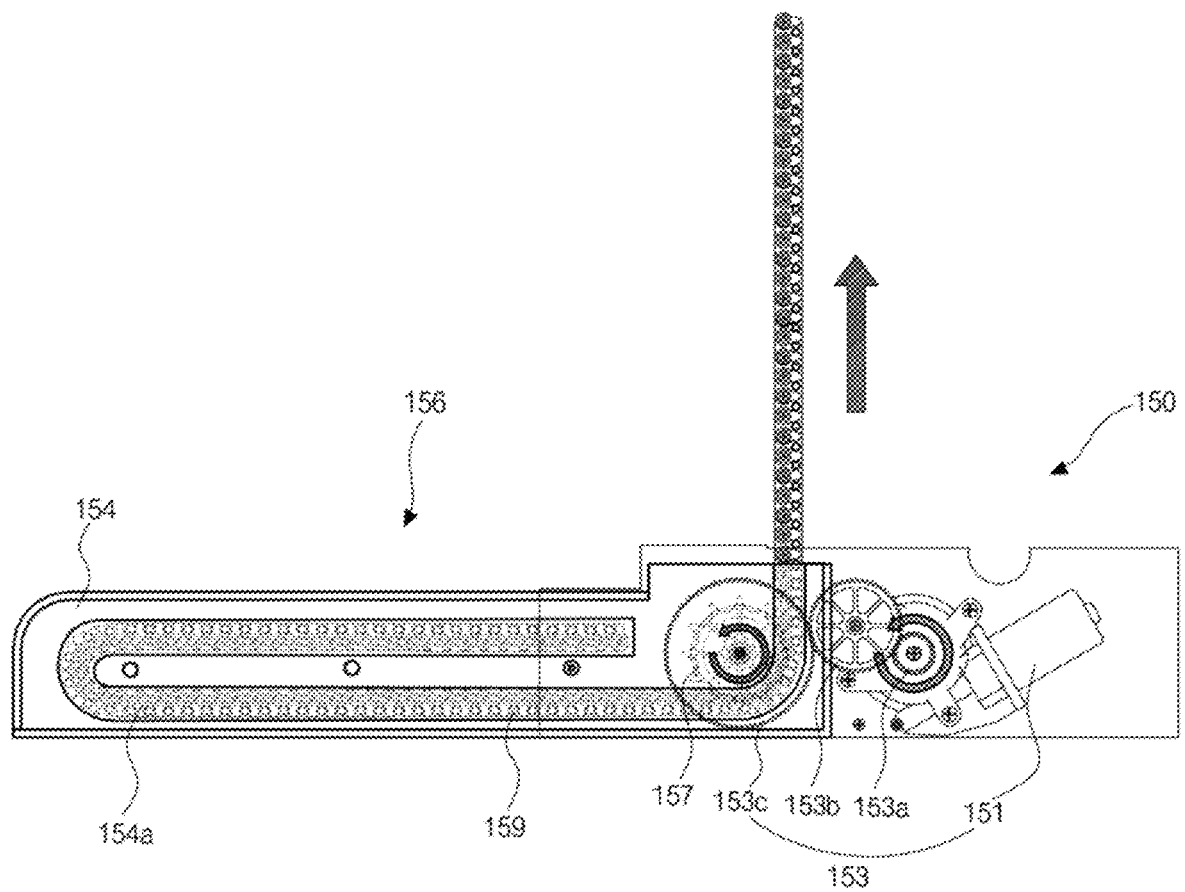
FIGS. 4B and 4C are front views illustrating the operation of the first driving system according to an aspect of the present disclosure.
Figure 4C:
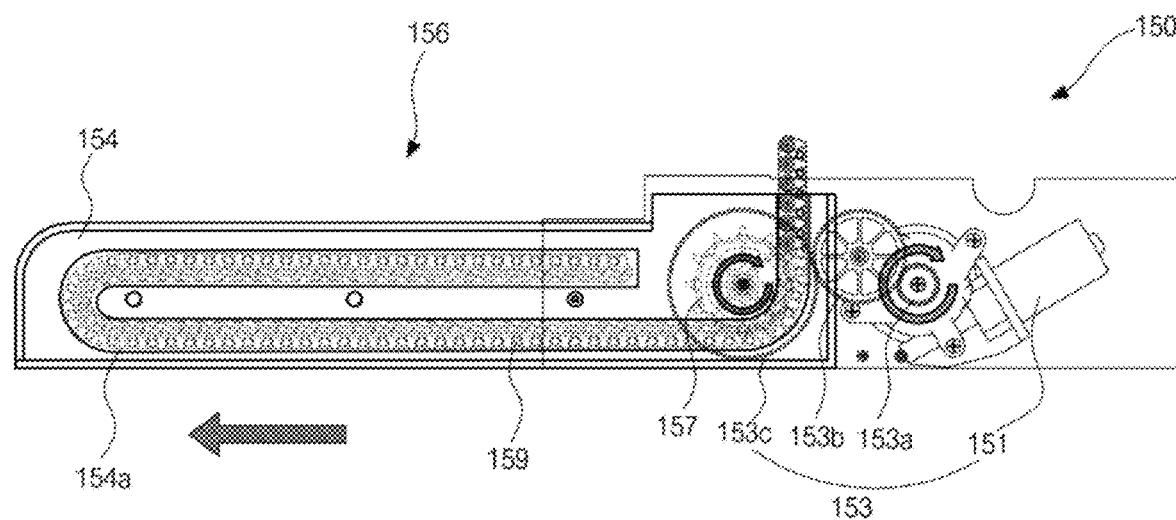
Figure 4D:
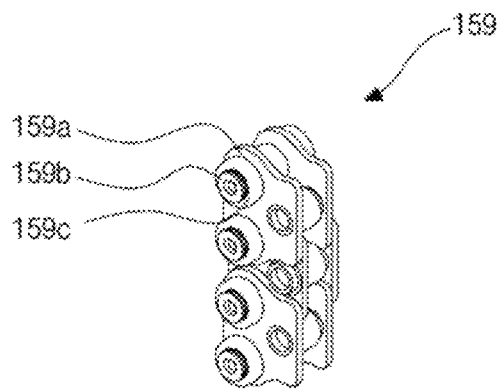
FIG. 4D is a perspective view illustrating a first rigid chain according to an aspect of the present disclosure.

FIG. 4A is a perspective view illustrating a first driving system according to an aspect of the present disclosure, FIGS. 4B and 4C are front views illustrating the operation of the first driving system according to an aspect of the present disclosure, and FIG. 4D is a perspective view illustrating a first rigid chain according to an aspect of the present disclosure.

As shown, the display device 100 according to the aspect of the present disclosure can include the cover module 110, the display panel 120, the light blocking plate 130, first and second driving systems 150 and 160, a pair of guide rails 170a and 170b, and first and second elevation assistance systems 180 and 190, but aspects of the present disclosure are not limited thereto.

The cover module 110 can have a box shape in which the display panel 110 and the first and second driving systems 150 and 160 are accommodated and can include a front cover 111 and a rear cover 113. The front cover 111 can be disposed on the front surface of the display panel 120, the light blocking plate 130 can be disposed on the rear surface of the display panel 120, and the rear cover 113 can be disposed on the rear surface of the light blocking plate 130.

Here, the display panel 120 can be one of various display devices such as a liquid crystal display device (LCD), a plasma display panel device (PDP), a field emission display device (FED), an electroluminescence display device (ELD), and organic light-emitting diode display device (OLED) and the like. The display panel 120 may use the OLED, which is a representative of a flexible display device capable of maintaining display performance even when bent like paper.

The OLED is a self-luminous device, and can be light-weight and thin because it does not require a backlight used in a liquid crystal display device that is a non-luminous device.

The OLED also has wide viewing angles and high contrast ratio as compared with the liquid crystal display device and is of lower power consumption. In addition, the OLED is driven by low voltages of direct current (DC) and has a fast response time. Further, the OLED is strong against the external impacts and is used in a wide range of temperatures because its components are solids.

Particularly, since the manufacturing process is simplified, the OLED has an advantage that the production cost can be greatly reduced compared to the liquid crystal display device.

The display panel 120 made of the OLED can include a first substrate and a second substrate facing the first substrate, and the first and second substrates can be spaced apart from and bonded to each other through an adhesive protective layer.

Although not shown, a driving thin film transistor can be formed for each pixel region on a first substrate, and a first electrode connected to each driving thin film transistor, an organic light-emitting layer on the first electrode and emitting light of a specific color, and a second electrode on the organic light-emitting layer can be provided for each pixel region.

The organic light-emitting layer can express red, green, and blue colors. In general, a separate organic material emitting red, green, or blue light can be patterned and used for each pixel.

The first and second electrodes and the organic light-emitting layer formed therebetween can constitute a light emitting diode. In the display panel having such a structure, the first electrode can serve as an anode, and the second electrode can serve as a cathode. However, the present disclosure is not limited thereto. Alternatively, the first electrode can serve as a cathode, and the second electrode can serve as an anode.

The display panel 120 according to the aspect of the present disclosure can include a transmission region and an emission region. The transmission region is a region that transmits the background seen through the rear surface of the display panel 120. For example, the background beyond the display panel 120 can be transmitted by the transmission region of the display panel 120 like transparent glass and can be provided to the user.

In addition, the light emitting diode can be disposed in the emission region to display the image information implemented by the display panel 120.

A first bottom cover 121 can be equipped at the lower end of the display panel 120 with respect to a first direction, which is the direction in which the display panel 120 is pulled up and withdrawn from the cover module 110. In an aspect, the first direction is +Y axis direction defined in the figures. However, the first direction could also be various directions applicable, e.g., a horizontal direction.

The first bottom cover 121 can be raised and lowered together with the display panel 120 while the display panel 120 is withdrawn from the cover module 110 or embedded in the cover module 110. When the display panel 120 is withdrawn from the cover module 110, the first bottom cover 121 can be disposed inside the cover module 110 to support the display panel 120.

The first bottom cover 121 can be connected to the first driving system 150.

As shown in FIG. 3A, a pair of first and second bushings 123a and 123b can be provided at both ends of the first bottom cover 121. The first and second bushings 123a and 123b can be respectively inserted into first and second guide bars 117a and 117b fixed to the cover module 110 and can be raised and lowered together with the display panel 120 along the longitudinal direction (e.g., +Y or −Y direction) of the first and second guide bars 117a and 117b, for example, the vertical direction in the context of the figures.

The first and second bushings 123a and 123b and the first and second guide bars 117a and 117b can be disposed on both sides of the cover module 110, respectively, and the display panel 120 can be stably raised and lowered without being biased to either side when lowered to the inside and raised to the outside of the cover module 110.

In this case, the first and second guide bars 117a and 117b can further include a stopper for limiting the lifting height of the first and second bushings 123a and 123b, but aspects of the present disclosure are not limited thereto.

Although not shown in the figures, a second bottom cover can also be equipped at the lower end of the light blocking plate 130 disposed on the rear surface of the display panel 120. The second bottom cover can be raised and lowered together with the light blocking plate 130 and disposed inside the cover module 110, but aspects of the present disclosure are not limited thereto.

The second bottom cover can be connected to the second driving system 160, but aspects of the present disclosure are not limited thereto. For example, the second bottom cover may be connected to the first driving system 150 or other driving system not mentioned herein, and second driving system 160 can operate with first driving system 150 simultaneously or asynchronously.

In addition, a pair of third and fourth bushings can be provided at both ends of the second bottom cover. The third and fourth bushings can be raised and lowered together with the light blocking plate 130 along the longitudinal direction of third and fourth guide bars 118a and 118b (see FIG. 2A) fixed to the cover module 110, for example, the vertical direction in the context of the figures.

The pair of guide rails 170a and 170b can be disposed at both ends of the display panel 120 and the light blocking plate 130 with respect to a second direction (e.g., transverse direction) perpendicular to the first direction in which the display panel 120 and the light blocking plate 130 are withdrawn. As shown in FIG. 3B, each of the pair of guide rails 170a and 170b can be provided with first and second fitting grooves 171 and 173 into which ends of the display panel 120 and the light blocking plate 130 are fitted and inserted, respectively.

Accordingly, the pair of guide rails 170a and 170b can support and guide both ends of each of the display panel 120 and the light blocking plate 130, respectively, when the display panel 120 and the light blocking plate 130 are raised and lowered from the cover module 110.

The first and second driving systems 150 and 160 connected to the first and second bottom covers 121, respectively, can be disposed below the display panel 120 and the light blocking plate 130. The first and second driving systems 150 and 160 can be disposed over a plate 115 forming a bottom surface of the cover module 110.

As shown in FIG. 4A, the first driving system 150 can include a first motor assembly 153 and a first chain assembly 156, and the first chain assembly 156 can include a first sprocket 157 receiving rotation of the first motor assembly 153 and a first rigid chain 159 engaged with the first sprocket 157 to switch its movement direction by the rotation of the first sprocket 157.

Here, the first motor assembly 153 can rotate the first sprocket 157 and can include an electric motor and a speed reducer. The electric motor can provide the rotational force by using electricity and can be variously selected from a servo motor, a step motor, and the like.

The first motor assembly 153 can precisely control a withdrawn length of the first rigid chain 159 moving in engagement with the first sprocket 157 by precisely controlling the rotation of the first sprocket 157.

The first motor assembly 153 can further include a first spur gear 153a connected to a rotatable shaft of a motor 151, a second spur gear 153b engaged with the first spur gear 153a, and a third spur gear 153c with a rotational shaft connected to the first sprocket 157. The first motor assembly 153 can reduce the number of rotations of the first, second, and third spur gears 153a, 153b, and 153c at a predetermined gear ratio to transmit the rotational force to the first sprocket 157, thereby rotating the first sprocket 157.

The first sprocket 157 can be rotatably disposed inside a first guide plate 154 positioned at one side of the first motor assembly 153. The first rigid chain 159 can be coupled around the first sprocket 157, and the first rigid chain 159 can move in the vertical direction by the rotation of the first sprocket 157.

In addition, a first chain rail 154a can be further provided inside the first guide plate 154. The first guide plate 154 can serve to limit the movement trajectory of the first rigid chain 159.

For example, when the first rigid chain 159 moves by the rotation of the first sprocket 157, the first rigid chain 159 can move inside the first guide plate 154 along the first chain rail 154a. As shown in FIG. 4C, the first rigid chain 159 can be rolled and accommodated in the first guide plate 154 along the first chain rail 154a, or as shown in FIG. 4B, the first rigid chain 159 can be pushed out from the first guide plate 154 by the rotation of the first sprocket 157 and can move vertically in a straight line.

Here, referring to FIG. 4D in more detail with respect to the first rigid chain 159, the first rigid chain 159 can have a structure in which a plurality of link units are connected in series so as to be bent between adjacent ones.

One link unit can have a configuration in which a pair of link plates 159a facing each other are connected to each other through a hinge 159b. The rigid chain 159 can have a structure in which the plurality of link units having such a configuration are connected to each other through the hinge 159b.

Support rollers 159c can be mounted on respective hinges 159b exposed to the outside of the link plate 159a. The support rollers 159c of the link units adjacent to each other can be positioned close to each other.

As described above, the link units can be coupled to each other by shielding each other through the hinges 159b so that the support rollers 159c are close to each other. Therefore, the first rigid chain 159 can be prevented from being crooked when it is raised in a straight line, so that the first rigid chain 159 can maintain linearity in the vertical direction.

One ends of the link units can be differently spaced apart from each other based on the hinges 159b near the first sprocket 157, so that the rigid chain 159 can form a curve near the first sprocket 157 while the first rigid chain 159 maintains linearity in its vertical portion.

For example, in the first rigid chain 159, the plurality of link units can be segmented and bent to form a curve, or the support rollers 159c of the plurality of link units can be close to each other to move in a straight line along the longitudinal direction.

Accordingly, by the rotation of the first sprocket 157, the first rigid chain 159 can be rolled and accommodated in a curve along the first chain rail 154a inside the first guide plate 154 (see FIG. 4C), or the first rigid chain 159 can be pushed out from the first guide plate 154 and can move vertically in a straight line (see FIG. 4B).

One end of the first rigid chain 159 can be coupled to the first bottom cover 121 of the display panel 120, so that the first rigid chain 159 can support the first bottom cover 121 and can raise and lower the first bottom cover 121 through the rotation of the first sprocket 157.

Therefore, the display panel 120 can also be raised and lowered together with the first bottom cover 121, and the display panel 120 can be pulled down and embedded inside the cover module 110 or can be pulled up and withdrawn outside the cover module 110.

In the first driving system 150, one end of the first rigid chain 159, for example, can be coupled to the center of the lower end of the first bottom cover 121 or a region adjacent to the center of the lower end, so that the display panel 120 that is raised and lowered can be easily maintained the level, but aspects of the present disclosure are not limited thereto.

Additionally, the second driving system 160 can also be configured as a structure similar to that of the first driving system 150. Although not shown, the second driving system 160 can include a second motor assembly and a second chain assembly. The second chain assembly can include a second sprocket receiving rotation of the second motor assembly and a second rigid chain engaged with the second sprocket and being movable in the vertical direction by the rotation of the second sprocket.

One end of the second rigid chain can be coupled to the second bottom cover of the light blocking plate 130, and the second rigid chain can support the second bottom cover, so that the second bottom cover can be raised and lowered through the rotation of the second sprocket.

By the rotation of the second sprocket, the second rigid chain can be rolled and accommodated in a curve along a second chain rail inside a second guide plate, or the second rigid chain can be pushed out from the second guide plate and can move vertically in a straight line. Therefore, the light blocking plate 130 can also be raised and lowered together with the second bottom cover, and the light blocking plate 130 can be embedded inside the cover module 110 or can be withdrawn outside the cover module 110.

The raising or lowering of the light blocking plate 130 through the second driving system 160 can be performed simultaneously with the display panel 120 or performed separately from the display panel 120 according to the user's intention.

Alternatively, in the display device 100 according to an aspect of the present disclosure, the display panel 120 and the light blocking plate 130 can be individually raised or lowered through the first and second driving systems 150 and 160, respectively, to be withdrawn out of the cover module 110 or embedded into the cover module 110.

In an aspect, in the display device 100 according to the aspect of the present disclosure, the first and second driving systems 150 and 160 for raising and lowering the display panel 120 and the light blocking plate 130, respectively, can be allowed to be driven based on the first rigid chain 159 and the second rigid chain, and it is possible to prevent or reduce a problem of a decrease in reliability due to the driving belt from occurring. It is to be understood that the foregoing aspects of the first driving system and/or the second driving system are exemplary and explanatory. A first driving system and/or a second driving system according to example aspects of the present disclosure is not limited a particular structure or constitution, such as the quantity and/or position of parts. For example, the light blocking plate 130 may be attached to the display panel 120 and embedded into the cover module 110 or withdrawn out of the cover module 110 together with the display panel 120 by the driving of the first driving system 150. Thus, the second driving system 160 may be omitted.

For example, in the case of a driving system including a belt, when the belt is used for a long time, deformation can occur due to a decrease in the tension of the belt. In this case, vibration noise can be generated due to vibration of the belt, or the display panel 120 can be unstably raised and lowered.

Alternatively, damage to the display panel 120 can also be caused in the process of raising and lowering the display panel 120.

In contrast, in the display device 100 according to the aspect of the present disclosure, the first and second driving systems 150 and 160 can be configured to include the first rigid chain 159 and the second rigid chain having semi-permanent advantages, it is possible to prevent or alleviate the first rigid chain 159 and the second rigid chain from being deformed even when used for a long time.

In addition, the first and second driving systems 150 and 160 including the first rigid chain 159 and the second rigid chain according to the aspect of the present disclosure can have a very simplified structure and minimize or reduce the number of parts, so that the manufacturing cost of the display device 100 can also be reduced.

At this time, as shown in FIG. 2C, a control printed circuit board 127a connected to the display panel 120, a main board 127b, and a power board 127c can be mounted inside the cover module 110, and a cable penetrating member 128 can also be further provided to protect a cable for connecting the main board 127b and the control printed circuit board 127a and a power cable for connecting the power board 127c and the control printed circuit board 127a.

As shown in FIG. 2C, one end of the cable penetrating member 128 can be mounted on the cover module 110, and the other end of the cable penetrating member 128 can be coupled to the first bottom cover 121, so that the other end of the cable penetrating member 128 can be raised and lowered together with the first bottom cover 121 when the display panel 120 is raised and lowered with respect to the cover module 110.

In the cable penetrating member 128, a plurality of connecting members having an empty space therein can be rotatably connected to each other so that the cable can pass through from the one end to the other end of the cable penetrating member 128. Accordingly, when the display panel 120 is raised and lowered, the cable penetrating member 128 can maintain the "U" shape in which lengths of both sides thereof are changed so as to allow the cable to be raised and lowered without being interfered and damaged by the surrounding electronic components.

The display device 100 according to the aspect of the present disclosure can further include the first and second elevation assistance systems 180 and 190. By controlling the speeds of raising and lowering of the display panel 120 and the light blocking plate 130 from the cover module 110 through the first and second elevation assistance systems 180 and 190, it is possible to prevent or alleviate the display panel 120 and the light blocking plate 130 from being rapidly lowered when embedded inside the cover module 110.

This will be described in more detail with reference to FIGS. 5A and 5B.

Figure 5A:
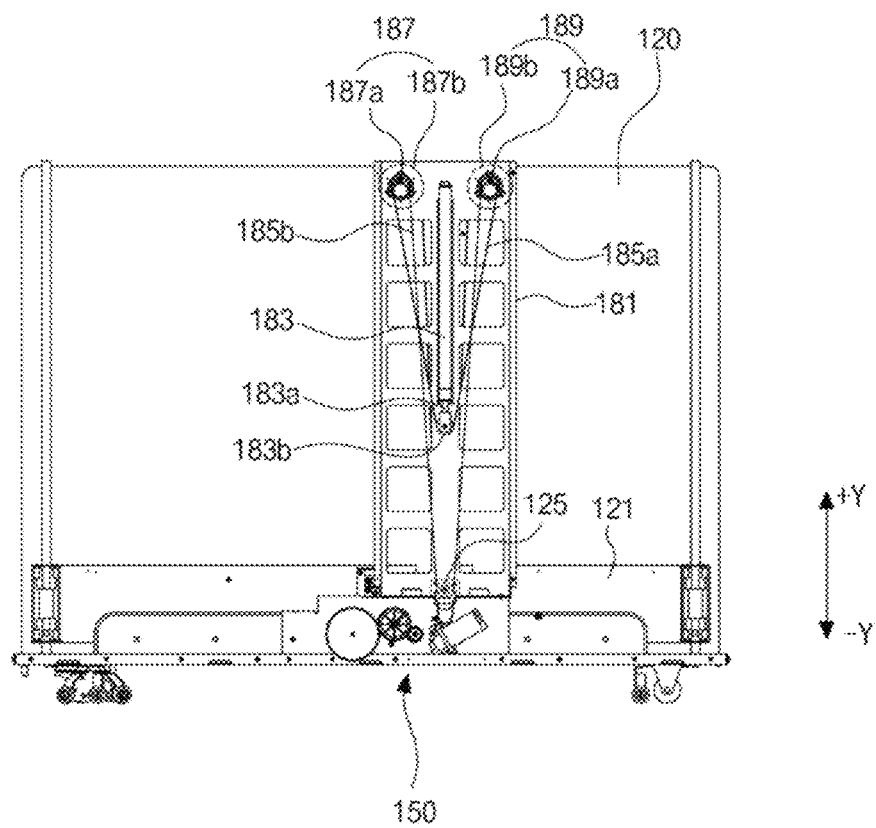
FIGS. 5A and 5B are perspective views illustrating operation of the first elevation assistance system according to an aspect of the present disclosure.
Figure 5B:
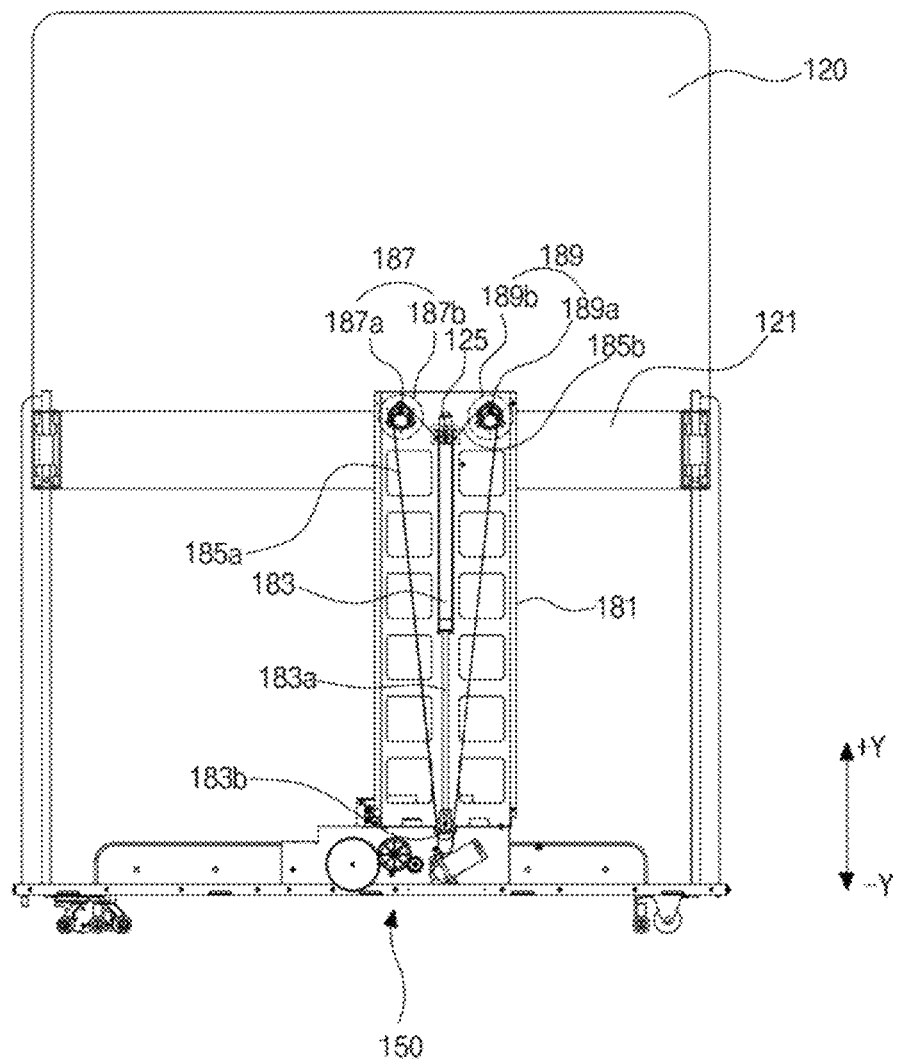

FIGS. 5A and 5B are perspective views illustrating the display panel and the first elevation assistance system of the display device according to the aspect of the present disclosure. For example, FIG. 5A shows a state in which the display panel is pulled down and embedded inside the cover module, and FIG. 5B shows a state in which the display panel is pulled up and withdrawn outside the cover module.

As shown in FIGS. 2C, 5A and 5B, a rotatable first bottom wheel 125 can be mounted on the first bottom cover 121 equipped at the lower end of the display panel 120, and the first elevation assistance system 180 can be disposed on the front side of the display panel 120 corresponding to the first bottom wheel 125.

The first elevation assistance system 180 can include a first elevation plate 181, a first gas spring 183 equipped to the first elevation plate 181, first and second wires 185a and 185b connected to the first gas spring 183, and a first wheel bracket 187 and a second wheel bracket 189.

The first elevation plate 181 can be formed to have its longitudinal direction along the first direction in which the display panel 120 is withdrawn from the cover module 110 of FIG. 2A. The first wheel bracket 187 and the second wheel bracket 189 can be quipped at the upper end of the front surface of the first elevation plate 181 based on the rear surface of which can face the display panel 120, and the first gas spring 183 can be disposed between the first wheel bracket 187 and the second wheel bracket 189.

The first wheel bracket 187 and the second wheel bracket 189 can penetrate the first elevation plate 181, first and second wheels 187a and 189a can protrude from the front surface of the first elevation plate 181, and third and fourth wheels 187b and 189b interlocked with the first and second wheels 187a and 189a, respectively, can protrude from the rear surface of the first elevation plate 181.

The first gas spring 183 can be equipped with a first rod 183a that increases or decreases along the longitudinal direction of the first gas spring 183 (e.g., +Y or −Y direction), and a first spring wheel 183b can be installed at one end of the first rod 183a. The first wire 185a can be wound around the first spring wheel 183b while its one end is rotatably fixed to the first wheel 187a and its other end is rotatably fixed to the second wheel 189a.

The second wire 185b can be wound around the first bottom wheel 125 mounted on the bottom cover 121 of the display panel 120 while its one end is rotatably fixed to the third wheel 187b protruding from the rear surface of the first elevation plate 181 and its other end is rotatably fixed to the fourth wheel 189b.

At this time, the one ends of the first and second wires 185a and 185b can be fixed to the first and third wheels 187a and 187b, respectively, to be wound in opposite directions to each other. The other ends of the first and second wires 185a and 185b can be fixed to the second and fourth wheels 189a and 189b, respectively, to be wound in opposite direction to each other.

The first gas spring 183 tries to expand its volume according to the amount of gas filled therein, so that the first gas spring 183 can make the first and second wires 185a and 185b increase by the force to expand the volume. Accordingly, when the one end of the first wire 185a is wound around the first wheel 187a, the one end of the second wire 185b can be unwound from the third wheel 187b. When the other end of the first wire 185a is wound around the second wheel 189a, the other end of the second wire 185b can be unwound from the fourth wheel 189b.

On the contrary, when the one end and the other end of the first wire 185a are unwound from the first and second wheels 187a and 189a, respectively, the one end and the other end of the second wire 185b can be wound around the third and fourth wheels 187b and 189b, respectively.

For example, as shown in FIG. 5A, in a pull-down state when the display panel 120 is embedded inside the cover module 110 of FIG. 2A, the first bottom cover 121 equipped at the lower end of the display panel 120 can be disposed to correspond to the lower end of the first elevation assistance system 180, and the second wire 185b wound around the third and fourth wheels 187b and 189b can be unwound, thereby increasing the length of the second wire 185b. Through this, the first wire 185a can be wound around the first and second wheels 187a and 189a.

Accordingly, the first rod 183a of the first gas spring 183 can be embedded and disposed inside the first gas spring 183.

At this time, when the display panel 120 is to be withdrawn from the cover module 110 of FIG. 2A through the first driving system 150, for example, when the display panel 120 is to be disposed in the pull-up state from the pull-down state, the display panel 120 can be withdrawn from the cover module 110 of FIG. 2A, and the second wire 185b can be wound around the third and fourth wheels 187b and 189b, so that the first wire 185a can be unwound from the first and second wheels 187a and 189a and become longer.

In addition, in the first gas spring 183 of the first elevation assistance system 180, the first rod 183a can be extended in the +Y axis direction defined in the figures, and thus the force can be applied to the first gas spring 183 in the +Y axis direction defined in the figures.

Accordingly, the force can also be applied to the display panel 120 withdrawn from the cover module 110 of FIG. 2A in the +Y axis direction defined in the figures. Since the forces can be applied to the first elevation assistance system 180 and the display panel 120 in the same or substantially same direction, the display panel 120 can be more easily withdrawn from the cover module 110 of FIG. 2A with a small force.

On the contrary, as shown in FIG. 5B, when the display panel 120 is disposed to be withdrawn outside the cover module 110 of FIG. 2A, for example, when the display panel 120 is to be disposed in the pull-down state from the pull-up state, the first bottom cover 121 equipped at the lower end of the display panel 120 can be disposed to correspond to the upper end of the first elevation assistance system 180, and the second wire 185b can be wound around the third and fourth wheels 187b and 189b. Through this, the first wire 185a can be unwound from the first and second wheels 187a and 189a and become longer.

Accordingly, the first rod 183a of the first gas spring 183 can be extended to the outside of the first gas spring 183.

In this case, when the display panel 120 is tried to be embedded inside the cover module 110 of FIG. 2A through the first driving system 150, the second wire 185b can be unwound from the third and fourth wheels 187b and 189b due to the display panel 120 embedded inside the cover module 110 of FIG. 2A, so that the first wire 185a can be wound around the first and second wheels 187a and 189a.

In addition, in the first gas spring 183 of the first elevation assistance system 180, the first rod 183a can be gradually reduced from the state in which the first rod 183a is extended in the +Y axis direction defined in the figures, and the force can be applied to the first gas spring 183 in the +Y axis direction defined in the figures until the first rod 183a is completely inserted into the first gas spring 183.

Accordingly, a force can be applied to the display panel 120 embedded into the cover module 110 of FIG. 2A in the −Y axis direction defined in the figures. The forces can be applied to the first elevation assistance system 180 and the display panel 120 in the opposite directions.

At this time, since the force applied to the first elevation assistance system 180 and the force applied to the display panel 120 are balanced with each other, the user can easily lower the display panel 120 at a stable speed.

Therefore, it is possible to prevent or alleviate the display panel 120 from being rapidly lowered in the process of embedding the display panel 120 inside the cover module 110 of FIG. 2A, and it is also possible to prevent or alleviate the display panel 120 from being damaged.

Here, the second elevation assistance system 190 of FIG. 2A can also have the same or substantially same structure as the first elevation assistance system 180, so that when the light blocking plate 130 of FIG. 2A is raised and lowered through the second driving system 160 of FIG. 2A, the speeds of raising and lowering the light blocking plate 130 of FIG. 2A from the cover module 110 of FIG. 2A can be controlled through the second elevation assistance system 190 of FIG. 2A. Accordingly, it is possible to prevent or alleviate the light blocking plate 130 of FIG. 2A from being rapidly lowered in the process of embedding the light blocking plate 130 of FIG. 2A inside the cover module 110 of FIG. 2A.

As described above, in the display device 100 of FIG. 2A according to the aspect of the present disclosure, the display panel 120 and the light blocking plate 130 of FIG. 2A can be allowed to be individually raised and lowered so as to be withdrawn from or embedded into the cover module 110 of FIG. 2A. Thus, the display panel 120 and the light blocking plate 130 of FIG. 2A can be raised and lowered from furniture, an appliance, a vehicle, a facility, or the like such as a bed headboard, a desk, or a partition through a simplified structure and operation such as the first and second driving systems 150 and 160 of FIG. 2A including the first rigid chain 159 of FIG. 4A and the second rigid chain to thereby improve space utilization, interior, and design.

In addition, the first and second driving systems 150 and 160 including the first rigid chain 159 and the second rigid chain according to the aspect of the present disclosure can have a very simplified structure and minimize or reduce the number of parts, so that the manufacturing cost of the display device 100 can also be reduced.

Moreover, through the transparent display panel 120, the user can be allowed to watch the image at both sides of the display panel 120, and the light blocking plate 130 of FIG. 2A can be further raised and lowered on the rear surface of the transparent display panel 120, so that the concentration of the image implemented through the transparent display panel 120 can be improved. Accordingly, the user can feel the image implemented from the display panel 120 more clearly.

Further, the display device 100 of FIG. 2A according to the aspect of the present disclosure can further include the first and second elevation assistance systems 180 and 190 of FIG. 2A, and the speeds of raising and lowering the display panel 120 and the light blocking plate 130 of FIG. 2A can be controlled, so that the display panel 120 and the light blocking plate 130 of FIG. 2A can be prevented or alleviated from being rapidly lowered in the process of embedding them inside the cover module 110 of FIG. 2A.

Meanwhile, in the above description, it has been shown and described that the first chain assembly 156 of FIG. 4B and the second chain assembly are arranged for the first and second driving systems 150 and 160 of FIG. 2A, respectively. However, the first chain assembly 156 of FIG. 4B and the second chain assembly can be arranged in pairs for at least one of the first and second driving systems 150 and 160 of FIG. 2A.

When the first chain assembly 156 of FIG. 4B and the second chain assembly are arranged in pairs, the first chain assembly 156 of FIG. 4B and the second chain assembly can be engaged with each other in the process of linear movement of two rigid chains 159 of FIG. 4A.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a cover module having a storage space therein;
a display panel configured to be at least partially disposed inside the storage space or withdrawn outside the storage space;
a first driving system configured to embed the display panel into the cover module or withdraw the display panel from the cover module in a first direction;
a bottom cover is equipped at a lower end of the display panel, and a bottom wheel is mounted on the bottom cover, and
a first elevation assistance system is coupled to the bottom wheel,
wherein the first driving system includes a first rigid chain,
wherein the first elevation assistance system includes an elevation plate, first and second wheel brackets, a gas spring between the first and second wheel brackets, and first and second wires, and
wherein a rod provided with a spring wheel at an end thereof is mounted at the gas spring.

2. The display device of claim 1, wherein the first rigid chain includes a plurality of link units connected in series to be bent between adjacent link units of the plurality of link units.

3. The display device of claim 2, wherein each of the plurality of link units includes:
a hinge;
a pair of link plates facing each other and connected to each other through the hinge; and
a support roller mounted on the hinge exposed to outside of each of the pair of link plate.

4. The display device of claim 1, wherein a bottom cover is equipped at a lower end of the display panel, and one end of the first rigid chain is connected to the bottom cover.

5. The display device of claim 1, wherein the first driving system includes a motor assembly and a chain assembly, and the chain assembly includes the first rigid chain and a sprocket engaged with the first rigid chain, and
wherein the sprocket receives a rotational force from the motor assembly and is configured to switch a movement direction of the first rigid chain by rotation of the sprocket.

6. The display device of claim 5, wherein the chain assembly is disposed inside a guide plate, and a chain rail for guiding movement of the first rigid chain is provided inside the guide plate.

7. The display device of claim 5, wherein the motor assembly further includes a motor and a spur gear receiving the rotational force of the motor, and
wherein the spur gear has a rotational shaft connected to the sprocket.

8. The display device of claim 4, wherein a pair of bushings are mounted on both ends of the bottom cover, and the pair of bushings are inserted into a pair of guide bars equipped to the cover module to be moved in the first direction.

9. The display device of claim 1, wherein the first driving system is disposed inside the storage space.

10. The display device of claim 1, wherein, the first direction is a vertical direction.

11. The display device of claim 1, wherein the first wire is disposed on a front surface of the elevation plate, and the second wire is disposed on a rear surface of the elevation plate,
wherein the first wire is wound around the spring wheel while its one end is fixed to a first wheel of the first wheel bracket and its other end is fixed to a second wheel of the second wheel bracket, and
wherein the second wire is wound around the bottom wheel while one end is fixed to a third wheel of the first wheel bracket and another end is fixed to a fourth wheel of the second wheel bracket.

12. The display device of claim 11, wherein the third wheel is interlocked with the first wheel, and the fourth wheel is interlocked with the second wheel.

13. A display device comprising:
a cover module having a storage space therein;
a display panel configured to be at least partially disposed inside the storage space or withdrawn outside the storage space;
a light blocking plate on a rear surface of the display panel and configured to be at least partially embedded inside the storage space or withdrawn outside the storage space;
a first driving system configured to embed the display panel into the cover module or withdraw the display panel from the cover module in a first direction; and
a second driving system configured to embed the light blocking plate into the cover module or withdraw the light blocking plate from the cover module in the first direction,
wherein the first driving system includes a first rigid chain, and,
wherein the second driving system includes a second rigid chain.

14. The display device of claim 1, wherein the second driving system is disposed inside the storage space.

15. The display device of claim 1, wherein the display panel is a transparent display panel.

16. The display device of claim 1, wherein a pair of guide rails are disposed at both ends of the cover module in a second direction perpendicular to the first direction and provided with fitting grooves for supporting both ends of each of the display panel and the light blocking plate, respectively.

* * * * *